(12) United States Patent
Menon et al.

(10) Patent No.: US 12,057,192 B2
(45) Date of Patent: Aug. 6, 2024

(54) MEMORY INTERFACE MAPPING

(71) Applicant: Cadence Design Systems, Inc., San Jose, CA (US)

(72) Inventors: Sreeja Menon, Bangalore (IN); Charles J. Wilson, Portland, OR (US); Sudhir Kumar Katla Shetty, Bangalore (IN); Larry Arbuthnot, Portland, OR (US); Nikhil Raghavendra Rao, Bangalore (IN)

(73) Assignee: Cadence Design Systems, Inc., San Jose, CA (US)

( * ) Notice: Subject to any disclaimer, the term of this patent is extended or adjusted under 35 U.S.C. 154(b) by 250 days.

(21) Appl. No.: 17/668,571

(22) Filed: Feb. 10, 2022

(65) Prior Publication Data

US 2022/0262415 A1 Aug. 18, 2022

Related U.S. Application Data

(60) Provisional application No. 63/150,245, filed on Feb. 17, 2021.

(51) Int. Cl.
| | |
|---|---|
| *G11C 7/22* | (2006.01) |
| *G11C 7/10* | (2006.01) |
| *G11C 8/18* | (2006.01) |
| *G11C 29/42* | (2006.01) |

(52) U.S. Cl.
CPC ............ *G11C 7/222* (2013.01); *G11C 7/1063* (2013.01); *G11C 7/109* (2013.01); *G11C 8/18* (2013.01); *G11C 29/42* (2013.01)

(58) Field of Classification Search
CPC ........................................................ G11C 7/22
USPC ........................................................ 365/233.1
See application file for complete search history.

(56) References Cited

U.S. PATENT DOCUMENTS

| | | | |
|---|---|---|---|
| 5,805,520 A | 9/1998 | Anglada et al. | |
| 2007/0143568 A1 | 6/2007 | Gould | |
| 2012/0239900 A1 | 9/2012 | Nautiyal et al. | |
| 2012/0250433 A1* | 10/2012 | Jeon ...................... | G06F 3/0614 |
| | | | 365/230.08 |
| 2013/0194854 A1 | 8/2013 | Shaeffer et al. | |
| 2013/0194881 A1 | 8/2013 | Woo et al. | |
| 2013/0311717 A1* | 11/2013 | Kim ..................... | G11C 11/1675 |
| | | | 365/158 |
| 2014/0189211 A1 | 7/2014 | George et al. | |
| 2014/0189224 A1 | 7/2014 | Kostinsky et al. | |
| 2019/0206458 A1 | 7/2019 | Shaeffer et al. | |
| 2022/0206695 A1* | 6/2022 | Zhao ..................... | G06F 3/0631 |

* cited by examiner

*Primary Examiner* — Muna A Techane
(74) *Attorney, Agent, or Firm* — Mark H. Whittenberger; Holland & Knight LLP

(57) ABSTRACT

System connections map interface connections between the memory device and the memory controller. The memory controller is configured with information about these 'mapped' connections. The memory controller uses the mapping information to: correctly present commands and addresses to the memory device, perform CA training on mapped connections, generate read training data that accounts for mapped connections, correctly address mapped memory device pins for write training per pin adjustments, correctly calculate error detection coding, and correctly read vendor identification information.

20 Claims, 18 Drawing Sheets

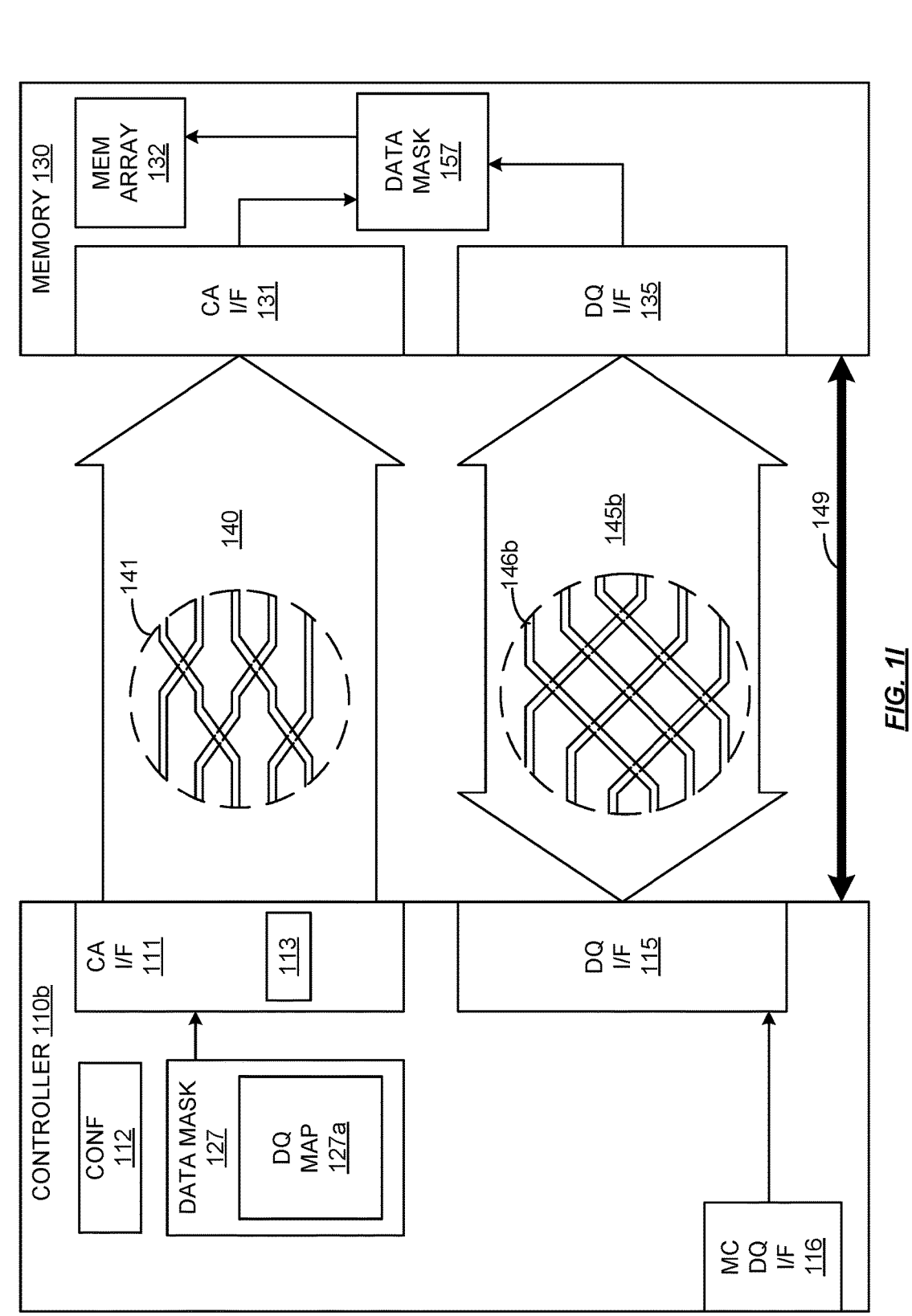

```
┌─────────────────────────────────────────────────────────────┐
│ RECEIVE INFORMATION ABOUT A FIRST MAPPING OF CONNECTIONS    │
│ THAT RELATES A PLURALITY OF COMMAND/ADDRESS (CA) PINS OF A  │
│   CA INTERFACE TO CA LOGICAL FUNCTIONS OF A MEMORY DEVICE   │
│                             402                             │
└─────────────────────────────────────────────────────────────┘
                              │
┌─────────────────────────────────────────────────────────────┐
│         RECEIVE INFORMATION ABOUT A SECOND MAPPING OF       │
│   CONNECTIONS THAT RELATES A PLURALITY OF DATA (DQ) PINS    │
│   OF A DQ INTERFACE TO DQ LOGICAL BIT ASSIGNMENTS OF THE    │
│                        MEMORY DEVICE                        │
│                             404                             │
└─────────────────────────────────────────────────────────────┘
                              │
┌─────────────────────────────────────────────────────────────┐
│     CONFIGURE FIRST CIRCUITRY TO REVERSE THE FIRST MAPPING  │
│       WHEN TRANSMITTING COMMANDS TO THE MEMORY DEVICE       │
│                             406                             │
└─────────────────────────────────────────────────────────────┘
                              │
┌─────────────────────────────────────────────────────────────┐
│  CONFIGURE SECOND CIRCUITRY TO REVERSE THE SECOND MAPPING   │
│                 TO PRODUCE UNMAPPED DATA.                   │
│                             408                             │
└─────────────────────────────────────────────────────────────┘
```

*FIG. 4*

MEMORY INTERFACE MAPPING

BRIEF DESCRIPTION OF THE DRAWINGS

FIGS. 1A-1I are illustrations of memory systems.

FIG. 4 is a flowchart illustrating a method of operating a memory controller.

DETAILED DESCRIPTION OF THE EMBODIMENTS

Some memory device standards assume that system (e.g., PC board) connections between interfaces of the memory controller and the memory device are made between corresponding terminals of the interfaces. For example, a memory device standard may assume that the command/address (CA) bit #5 (a.k.a., CA5, or CA[5]) terminal of the memory controller is to be connected, by the system board, to the CA5 terminal of the memory device. Likewise, for example, a memory device standard may assume that the data (DQ) bit #7 (a.k.a., DQ7 or DQ[7]) terminal of the memory controller is to be connected, by the system board, to the DQ7 terminal of the memory device.

Figure 1A:
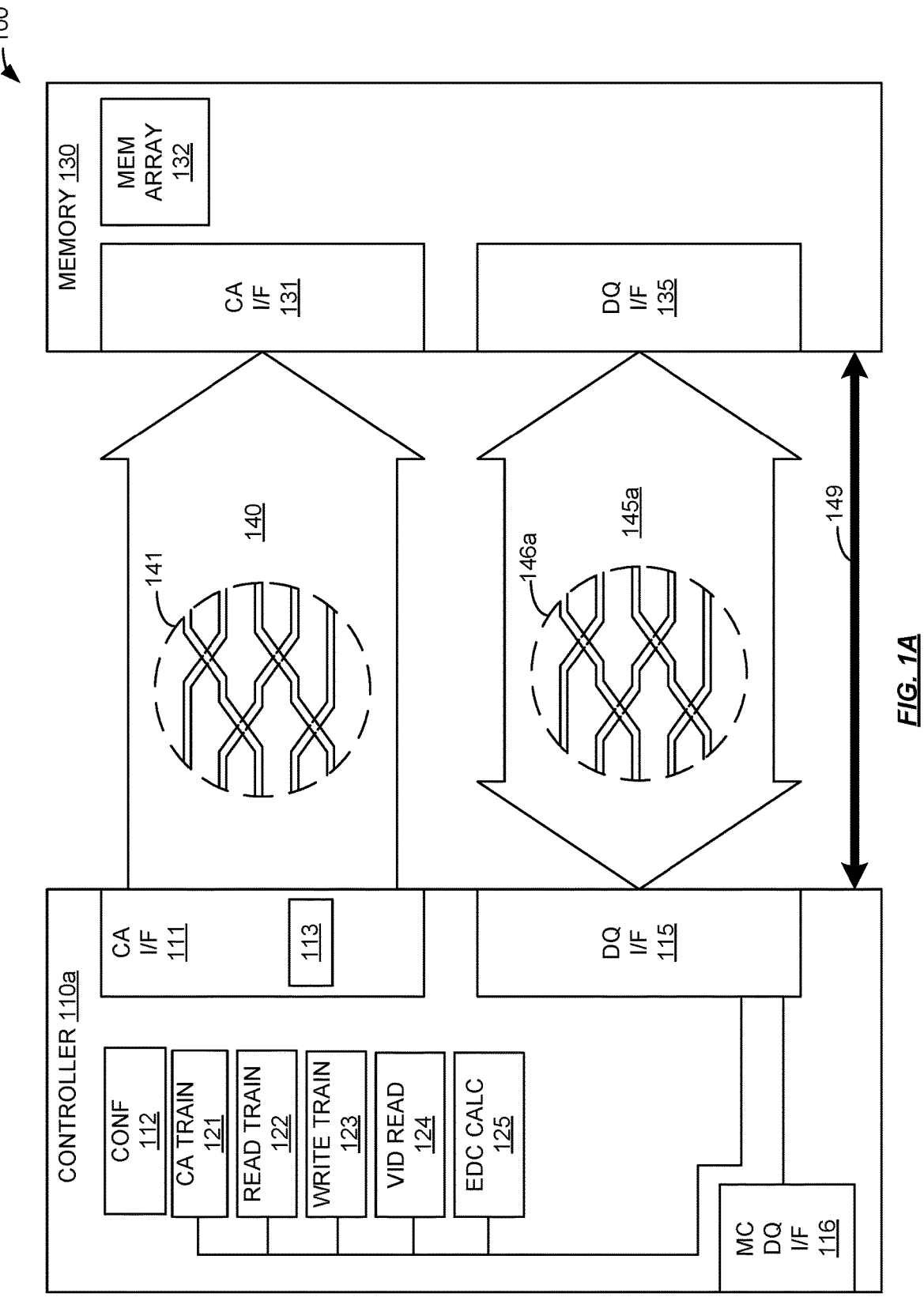
Figure 1B:
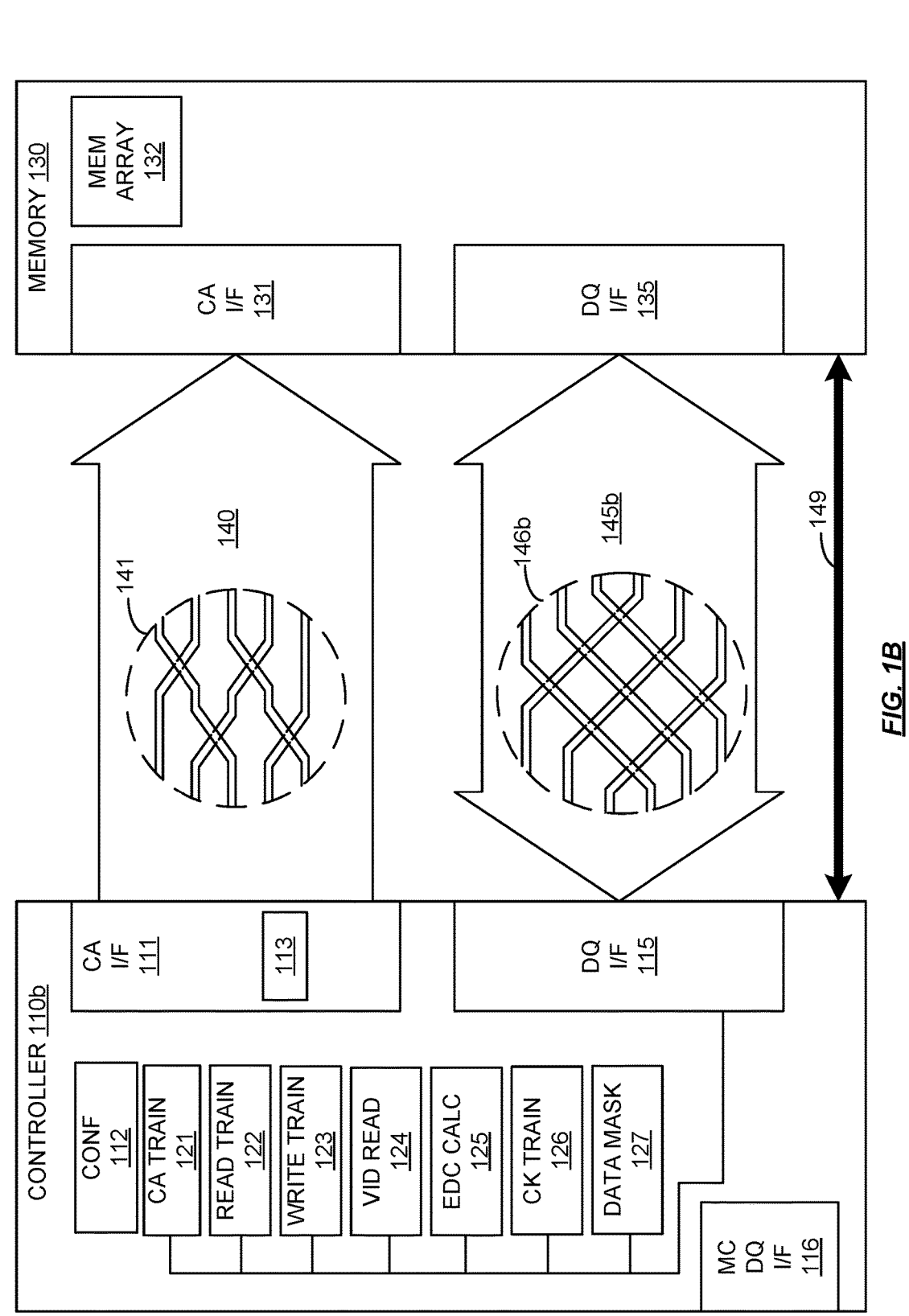
Figure 1C:
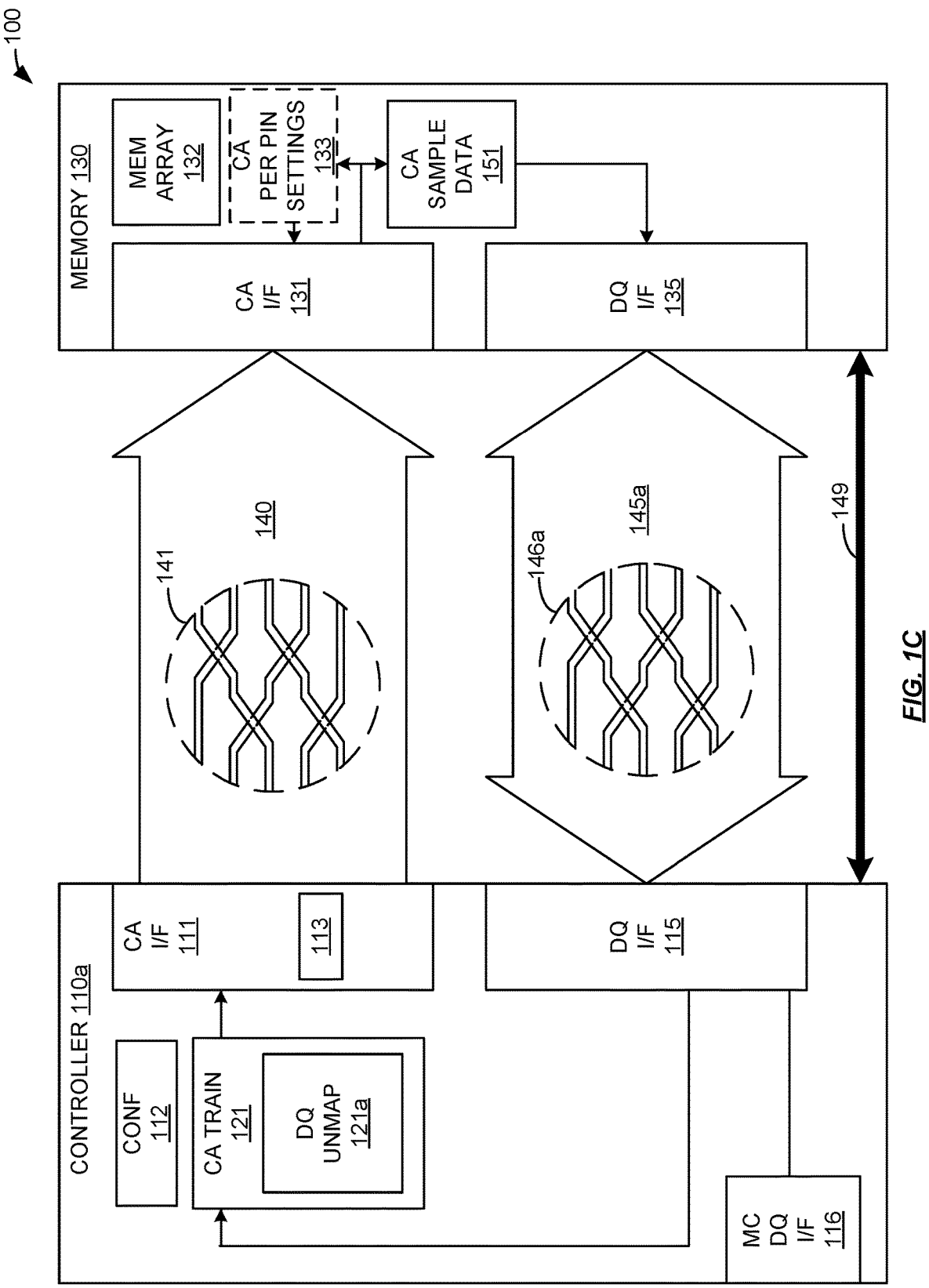
Figure 1D:
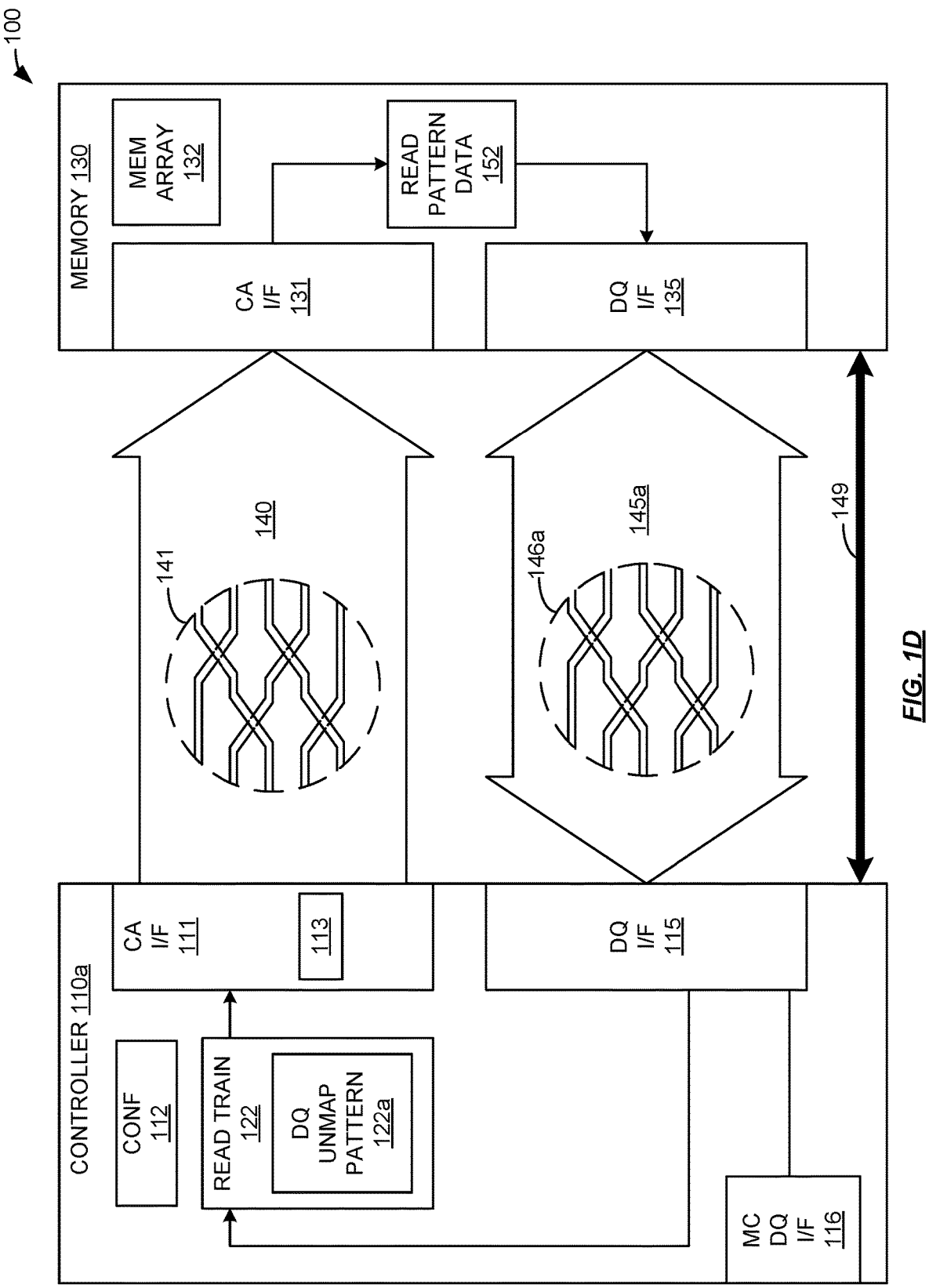
Figure 1E:
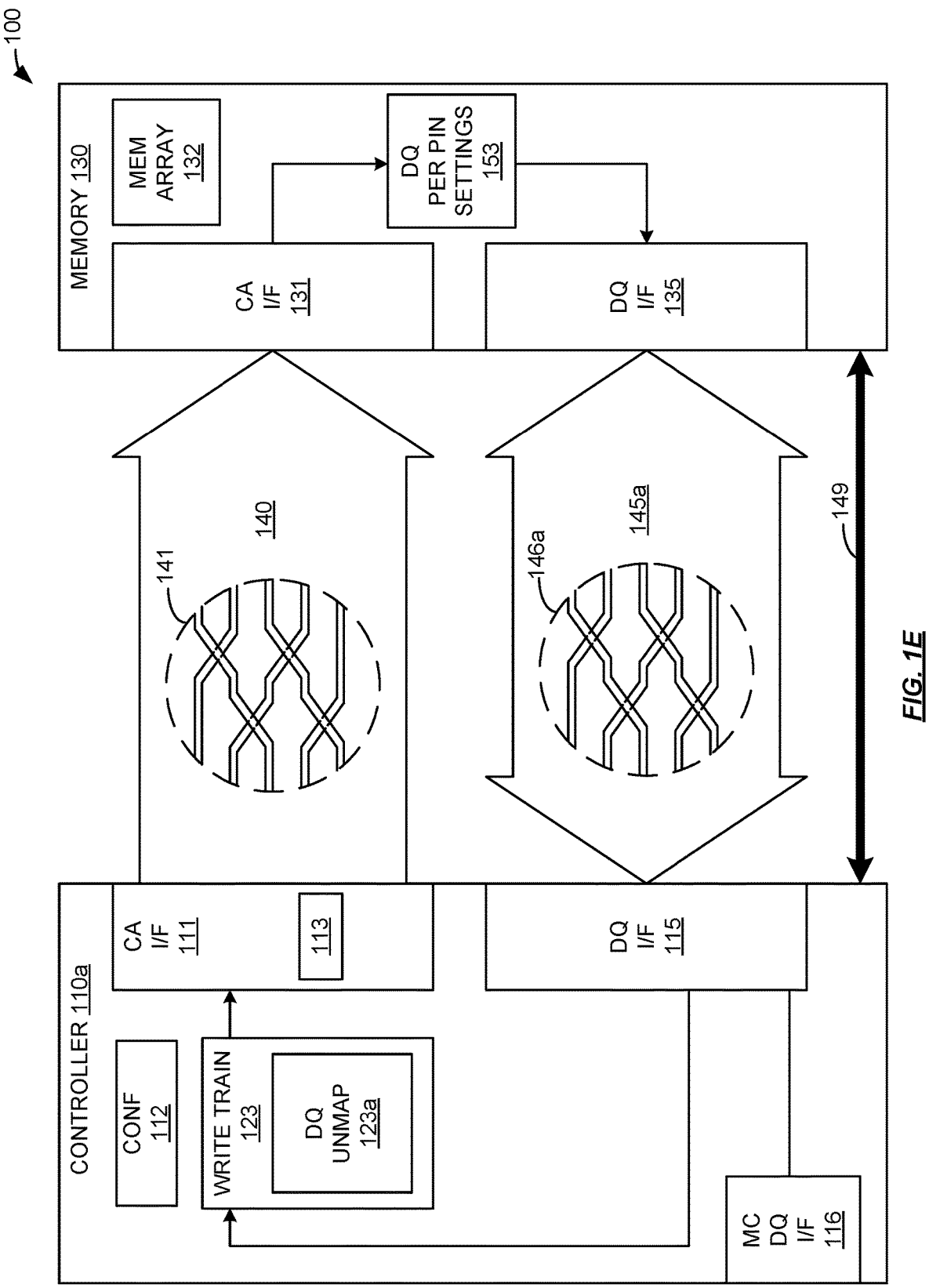
Figure 1F:
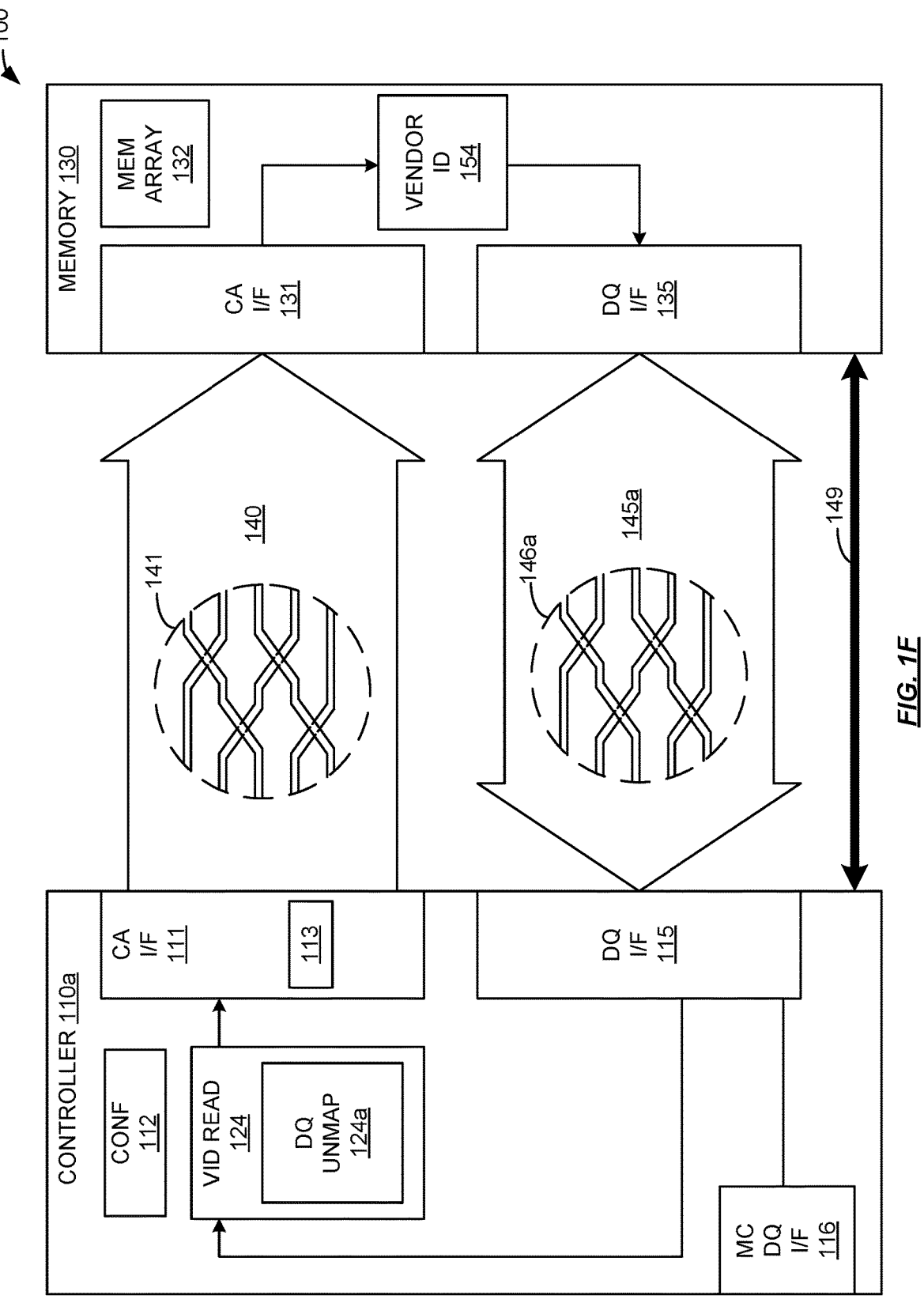
Figure 1G:
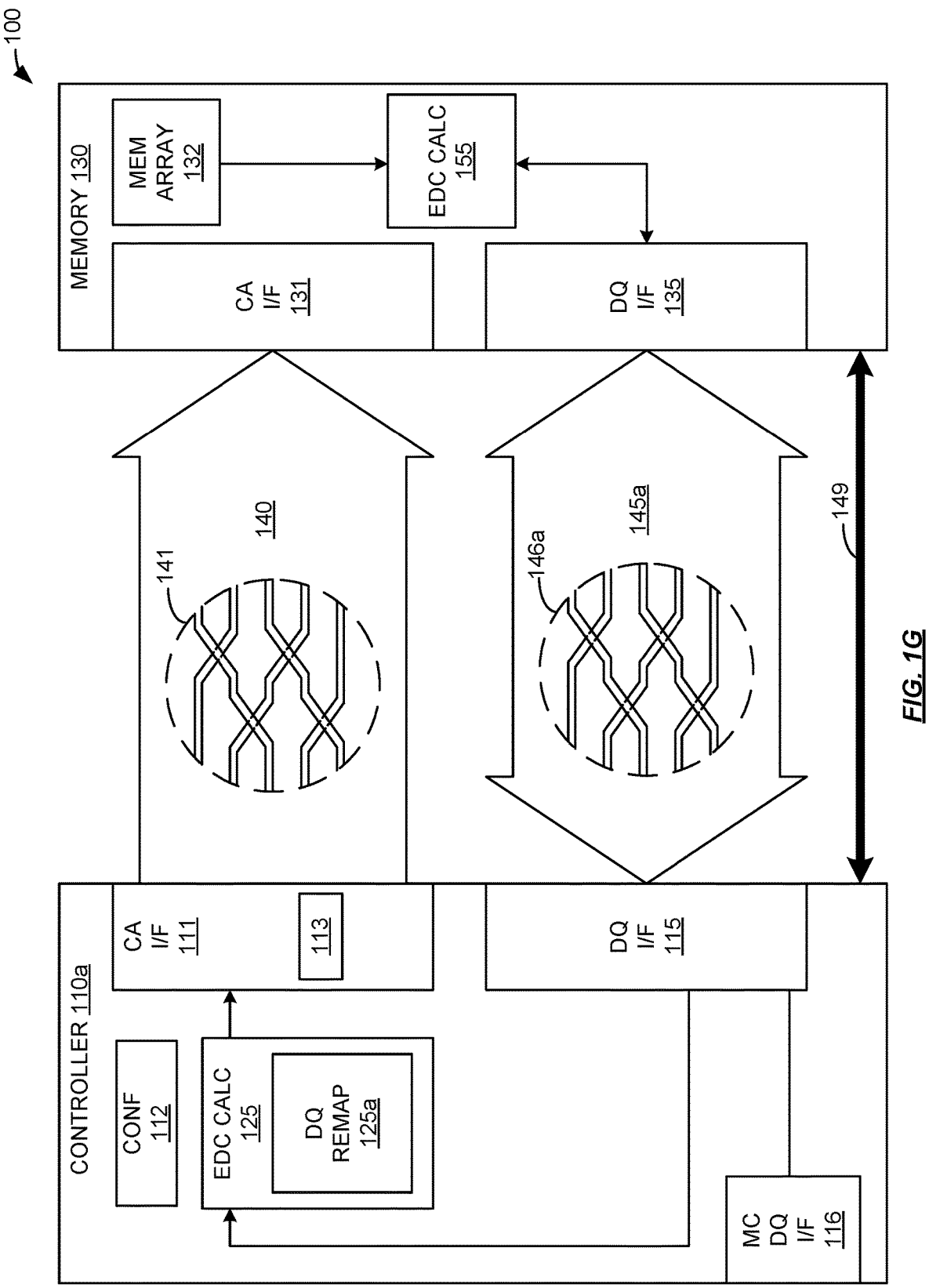
Figure 1H:
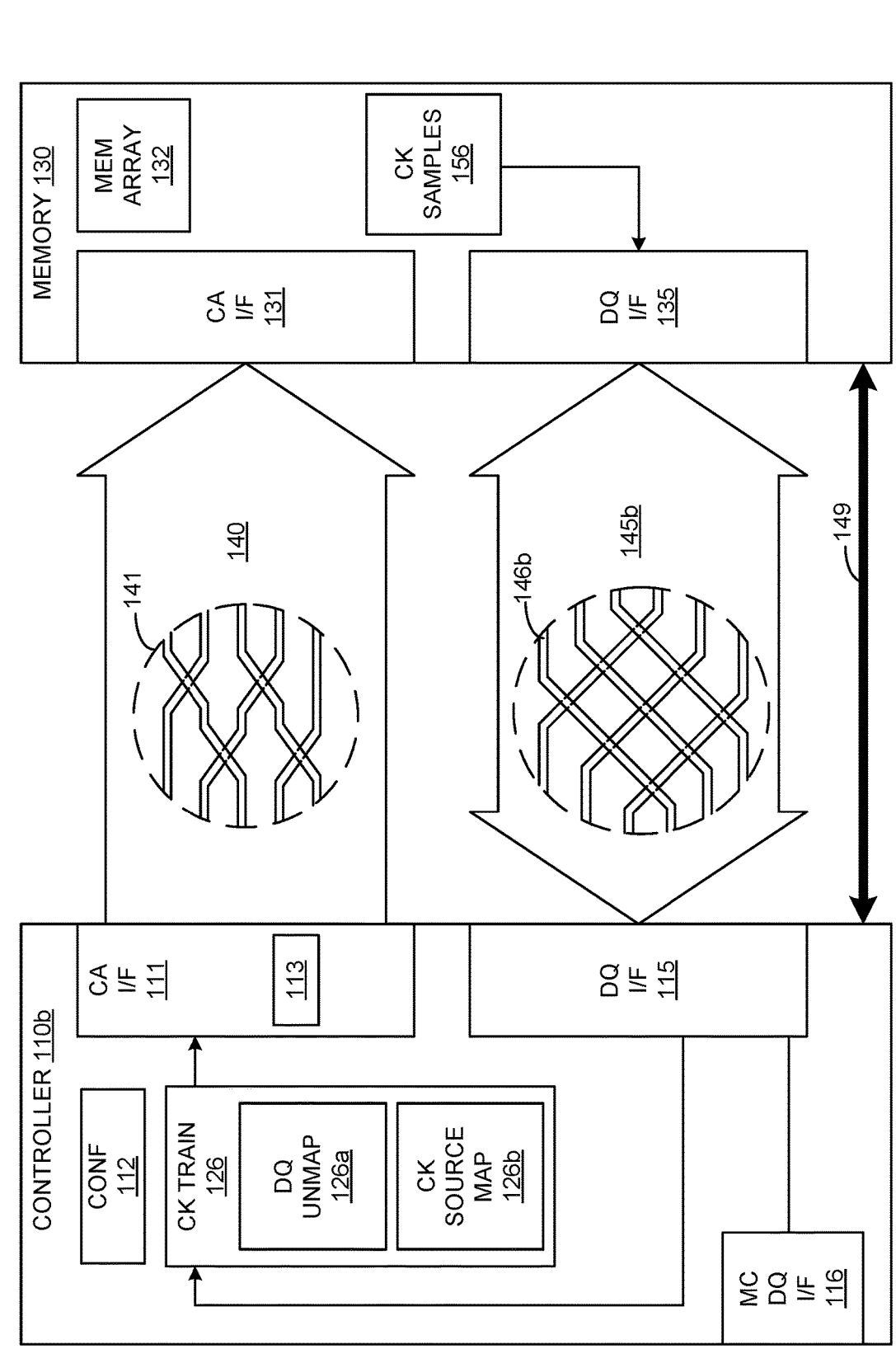

In an embodiment, system connections may map interface connections between the memory device and the memory controller. This may allow more convenient placement of the memory device, reduce crosstalk, reduce inter-symbol interference, provide more uniform signal routing lengths, and so on. For example, a system board may connect the CA5 terminal of the memory controller to the CA1 terminal of the memory device and/or the DQ7 terminal of the memory controller to the DQ1 terminal of the memory device. In an embodiment, the memory controller is configured with information about these 'mapped' connections. In several embodiments, the memory controller uses the mapping information to: correctly present commands and addresses to the memory device, perform CA training on mapped connections, generate read training data that accounts for mapped connections, correctly address mapped memory device pins for training adjustment (esp. per pin discrete finite equalization DFE—and reference voltage—VREFD adjustment), correctly calculate error detection coding, and correctly read vendor identification information FIGS. 1A-1I are illustrations of memory systems. In FIGS. 1A, 1C-1G, system 100 comprises controller 110a, memory device 130, command/address (CA) interconnect 140, data (DQ) interconnect 145a, and miscellaneous interconnect 149. In FIGS. 1B, 1H, and 1I, system 101 comprises controller 110b, memory device 130, CA interconnect 140, DQ interconnect 145b, and miscellaneous interconnect 149. System 100 and system 101 (and controller 110a and controller 110b, in particular) are substantially the same with the following exceptions: (1) DQ interconnect 145b of system 101 swaps entire DQ bytes and, in some embodiments, remaps bits within a byte while DQ interconnect 145a remaps DQ bits as individual bits without regard to byte boundaries; and, (2) the swapping of entire DQ bytes by system 101 allows controller 110b to perform the functions of clock training 126 and data mask 127 that may not be performed by controller 110a.

Memory device 130 includes CA interface 131, memory array 132, and DQ interface 135. Controllers 110a and 110b include CA interface 111, remap configuration register 112, DQ interface 115, memory controller (MC) DQ interface 116, CA training 121, read training 122, write training 123, vendor identification read 124, and error detection code (EDC) calculation 125. Controller 110b further includes clock training 126 and data mask 127. CA interface 111 includes remap circuitry 113. DQ interface 115 is operatively coupled to MC DQ interface 116, CA training 121, read training 122, write training 123, vendor identification read 124, and error detection code (EDC) calculation 125. DQ interface 115 of controller 110b is additionally operatively coupled to clock training 126 and data mask 127.

Controller 110a and controller 110b are operatively coupled to memory device 130 via CA interface 111, CA interconnect 140, and CA interface 131. CA interconnect 140 may map one or more signal terminals of CA interface 111 to a different signal terminal of CA interface 131. This is illustrated in FIGS. 1A-1H by interconnect mapping 141. Controller 110a is operatively coupled to memory device 130 via DQ interface 115, DQ interconnect 145a, and DQ interface 135. DQ interconnect 145a may map one or more signal terminals of DQ interface 115 to a different signal terminal of DQ interface 135. This is illustrated in FIGS. 1A, 1C-1G by interconnect mapping 146a. Controller 110b is operatively coupled to memory device 130 via DQ interface 115, DQ interconnect 145b, and DQ interface 135. DQ interconnect 145b may swap a group (e.g., byte, word, etc.) of signal terminals of DQ interface 115 to a different group (e.g., byte, word, etc.) of signal terminals of DQ interface 135. This is illustrated in FIG. 1B by interconnect mapping 146b. It should be understood that DQ interconnect 145b group swapping and/or optionally remapping bits within bytes (whether swapped or not) are instances of the possible DQ interconnect 145a mappings. Miscellaneous interconnect 149 operatively couples controller 110a and controller 110b to memory device 130 via various signals (e.g., clocks, test) that do not carry command/address information (e.g., CA[9:0], CABI, etc. for a GDDR6 compliant system) or data related information (e.g., DQ[15:0], DBI[1:0], EDC[1:0], etc. for a GDDR6 compliant system).

Controllers 110a-110b and memory component 120 may be integrated circuit type devices, such as are commonly referred to as a "chips". A memory controller, such as controllers 110a-110b, manages the flow of data going to and from memory devices and/or memory modules. Memory component 130 (also referred to as memory component 130) may be a standalone device, or may be a component of a memory module. Memory component 130 may be a device that adheres to, or is compatible with, a Graphics Double Data Rate 6 (GDDR6) Synchronous Graphics Random Access Memory (SGRAM) specification. A memory controller can be a separate, standalone chip, or integrated into another chip. For example, a memory controller may be included on a single die with a microprocessor, or included as part of a more complex integrated circuit system such as a block of a system on a chip (SOC).

In FIGS. 1A-1I, remap configuration register 112 configures remap circuitry 113 to map CA signals from other circuitry in controller 110a or controller 110b to undo the effects of interconnect mapping 141. In other words, for example, if interconnect mapping 141 connects the CA3 terminal of controller 110a or controller 110b to the CA9 terminal of memory device 130, one or more values stored in remap configuration register 112 may be selected to transmit the internal CA9 signal via the CA3 terminal of the controller 110a-110b. In this manner, memory device 130 may be unaware of the effects of interconnect mapping 141 and therefore may remain unmodified (i.e., compliant) with respect to a given memory device specification (e.g., GDDR6).

In an embodiment, systems 100-101 provide a means for CA interface 111 training. The controller 110a-110b may use a CA training mode for memory device 130 to improve the timing margins on the CA bus. For CA training, controller 110a-110b may configure memory device 130 to use an internal bridge between CA interface 131 and DQ interface 135. CA values sampled by CA interface 131 during training are transmitted to controller 110a-110b via DQ interface 135. FIG. 1C illustrates systems 100-101 in CA training mode.

In FIG. 1C, training signals are transmitted by controller 110a-110b to memory device 130 via interconnect 140 and are therefore mapped by interconnect mapping 141. The sampled training values 151 captured by CA interface 131 are provided to DQ interface 135. DQ interface 135 transmits the sampled training values 151 to controller 110a-110b via interconnect 145a-145b, respectively. Thus, the sampled training values 151 received by controller 110a-110b are mapped by interconnect mappings 146a-146b, respectively. DQ interface 115 transmits the received sampled training values to CA training 121.

It should be understood that the sampled training values received by CA training 121 may have been mapped by interconnect mapping 146a, interconnect mapping 146b, or both. Thus, to correctly evaluate the received sampled training values, and for optional CA per pin setting circuitry 133 to adjust one or more CA per pin settings (e.g., DFE and/or VREF—if implemented), CA training 121 may need DQ unmap 121a circuitry to undo the effects of interconnect mapping 146a-146b.

In an embodiment, systems 100-101 provide a means for DQ read training. A read training mode for memory device 130 allows controllers 110a-110b to find the data-eye optimal position (symbol training) and burst frame location (frame training) for each high-speed DQ interface 135 output of the memory device 130. Each pin of DQ interface 135 (e.g., DQ[15:0], DBI[1:0], EDC[1:0]) can be individually trained during this sequence.

For DQ read training, controller 110a-110b may configure memory device 130 to use internal storage (e.g., one or more first-in first-out buffers—FIFOs) to store read pattern data 152. The read pattern data 152 stored internal to memory device 130 are, in response to a command from controller 110a-110b, transmitted by DQ interface 135 to controller 110a-110b via interconnect 145a-145b, respectively. The read pattern data 152 stored internal to memory device 130 may be loaded into memory device 130 (e.g., into one or more FIFOs) via CA interface 111, CA interconnect 140, and CA interface 131. FIG. 1D illustrates systems 100-101 in read training mode.

In FIG. 1D, read data patterns are transmitted by controller 110a-110b to memory device 130 via CA interface 111 and interconnect 140 and the effects of interconnect mapping 141 may therefore be undone by configuration register 112's configuration of remap circuitry 113. The read pattern data 152 is provided to DQ interface 135. DQ interface 135 transmits the read pattern data 152 to controller 110a-110b via interconnect 145a-145b, respectively. Thus, the sampled read pattern data received by controller 110a-110b has been mapped by interconnect mappings 146a-146b, respectively. DQ interface 115 transmits the received read pattern data to read training 122.

It should be understood that read pattern data values received by read training 122 have been mapped by interconnect mapping 146a, interconnect mapping 146b, or both. Thus, to correctly produce read pattern data values 152, read training 122 needs DQ unmap pattern 122a circuitry to generate read data patterns that undo the effects of interconnect mapping 146a-146b.

In an embodiment, systems 100-101 provide a means for DQ write eye training. A write eye training mode for memory device 130 allows controllers 110a-110b to find the data-eye optimal position (symbol training) and burst frame location (frame training) for each high-speed DQ interface 135 input of the memory device 130. Each pin of DQ interface 135 (e.g., DQ[15:0], DBI[1:0], EDC[1:0]) can be individually trained during this sequence.

For DQ write eye training, controller 110a-110b may configure memory device 130 to use internal storage (e.g., one or more first-in first-out buffers—FIFOs) to store sampled data from DQ interface 135. In response to a command from controller 110a-110b, data transmitted by DQ interface 115 to memory device 130 via interconnect 145a-145b is sampled and the sampled data values stored internal to memory device 130. The sampled data patterns stored internal to memory device 130 may be read from memory device 130 (e.g., from one or more FIFOs) via DQ interface 135, interconnect 145a-145b, and DQ interface 115. FIG. 1E illustrates systems 100-101 in write eye training mode.

In FIG. 1E, write data patterns are transmitted by controller 110a-110b to memory device 130 via DQ interface 115, interconnect 145a-145b, and DQ interface 135. In response to one or more commands from controller 110a-110b, memory device 130 samples the write data patterns and stores the sampled write pattern data. In response to one or more commands, the sampled write pattern data is provided to DQ interface 135. DQ interface 135 transmits the sampled write pattern data to controller 110a-110b via interconnect 145a-145b, respectively. Thus, because the write pattern data was both transmitted to memory device 130 via interconnect 145a-145b, and the sampled write pattern data is received from memory device 130 via interconnect 145a-145b, the sampled write pattern data received by controller 110a-110b has the interconnect mappings 146a-146b undone. DQ interface 115 transmits the received write pattern data to write training 123.

Although the sampled write pattern data values received by write training 123 have not been mapped by interconnect mapping 146a or 146b, controller 110a-110b uses CA interface 111 to adjust discrete finite equalization (DFE) and reference voltage (e.g., VREFD) on a per pin basis (DQ per pin settings 143). Thus, to select the correct pin address (number) to adjust DFE or VREFD for that pin, write training 123 needs DQ unmap 123a circuitry to relate sampled write pattern data for a given pin to the pin number address used by memory device 130.

In an embodiment, systems 100-101 provide a means for reading vendor identification (VID) information 154 from memory device 130. FIG. 1F illustrates systems 100-101 reading VID information 154 from memory device 130. VID information stored internal to memory device 130 is, in response to a command from controller 110a-110b, transmitted by DQ interface 135 to controller 110a-110b via interconnect 145a-145b, respectively. Thus, the sampled VID data received by controller 110a-110b has been mapped by interconnect mappings 146a-146b, respectively. DQ interface 115 transmits the received VID data to VID read 124.

It should be understood that the VID data values received by VID read 124 have been mapped by interconnect mapping 146a or 146b. Thus, to correctly interpret VID data values, VID read 124 needs DQ unmap pattern 124a circuitry to generate, from the received VID read data, VID data values that undo the effects of interconnect mapping 146a-146b.

In an embodiment, systems 100-101 provide a means for checking and/or correcting errors in data stored by memory device 130. FIG. 1G illustrates systems 100-101 checking and/or correcting errors in data stored by memory device 130. In FIG. 1G, bursts of write data (e.g., 16 2-byte words—write data bursts) are transmitted by controller 110a-110b to memory device 130 via DQ interface 115, interconnect 145a-145b, and DQ interface 135. In response to one or more commands from controller 110a-110b, memory device 130 samples the write data burst and stores the write data in memory array 132. Memory device also computes an error detection correction code (a.k.a., EDC code information) on the write data burst and transmits the write data burst EDC code information to controller 110a-110b via interconnect 145a-145b, respectively.

In response to one or more commands, bursts of data stored in memory array 132 (a.k.a., read data bursts), along with an error detection correction code (a.k.a., EDC code information), are provided to DQ interface 135. DQ interface 135 transmits the read data burst and the EDC code information to controller 110a-110b via interconnect 145a-145b, respectively. Thus, because the write data burst was transmitted to memory device 130 via interconnect 145a-145b, and the read data burst is received from memory device 130 via interconnect 145a-145b, the read data burst has the interconnect mappings 146a-146b undone. However, the EDC code information received by controller 110a-110b may be calculated by EDC calculation circuitry 155 over an entire read or write burst communicated with memory device 130. Thus, the EDC information calculated by memory device 130 and transmitted to controllers 110a-110b was calculated on data bursts that are mapped by interconnect 145a-145b. EDC information for write data bursts are calculated after being received in a remapped form via DQ interface 135. EDC information for read data bursts are calculated after being stored in memory array 132 in a mapped form. DQ interface 115 transmits the received read data burst to EDC calculation 125.

Although the read data bursts received by EDC calculation 125 have not been mapped by interconnect mapping 146a or 146b, the EDC information calculated by memory device 130 and transmitted to controllers 110a-110b is calculated on read and write data bursts that are mapped by interconnect 145a-145b. Thus, to correctly calculate and check the EDC information. DQ remap 125a maps the read and/or write data burst to mimic the effects of interconnect mapping 146a-146b. DQ remap 125a maps the data bits in the read or write data burst to mimic the effects of interconnect mapping 146a-146b and provides the results to EDC calculation circuitry 125.

In an embodiment, system 101 provides a means for clock-to-clock training. The purpose of clock-to-clock (e.g., WCK2CK training for GDDR6) is to align the data clock (i.e., the clock determining the timing of DQ interface 135) with the CA clock (i.e., the clock determining the timing of CA interface 131). This clock-to-clock training aids in memory device 130's internal data synchronization between the logic clocked by the CA clock and the data clock.

Clock-to-clock training for system 101 is illustrated in FIG. 1H. For clock-to-clock training, controller 110b may configure memory device 130 to provide data clock versus CA clock phase information to controller 110b via a DQ interface 135 signal(s) (e.g., EDC[1] and/or EDC[0]). Because the phase information is received from memory device 130 via interconnect 145b, the pin of DQ interface 115 receiving the phase information may have been mapped by interconnect 145b. DQ interface 115 transmits the received phase information to clock training 126. To select the correct signal from DQ interface 115 that has the phase information, clock training 126 needs DQ unmap 126a circuitry to select the signal from DQ interface 115 that has the phase information.

In addition, DQ interface 115 may be timed by per-group (e.g., per byte) data clock signals. In this case, CK source map 126b may assign the primary byte during clock training based on interconnect mapping 146b. CK source map 126b may also, during clock training assign the correct data clock output based on interconnect mapping 146b.

In an embodiment, system 101 provides a means for masking bytes of data written to memory array 132. FIG. 1I illustrates system 101 writing data to memory device 130 where one or more groups of bits received via MC DQ interface 116 and transmitted via DQ interface 115 are not to be written to memory array 132 (a.k.a. data masking). Write data to be stored in memory array 132 of memory device 130 is, in response to a command from controller 110b, received by DQ interface 135 via interconnect 145b. Thus, the sampled write data received by memory device 130 has been mapped by interconnect mapping 146b to swap a group (e.g., byte, word, etc.) of signal terminals of DQ interface 115 to a different group (e.g., byte, word, etc.) of signal terminals of DQ interface 135.

The information (e.g., mask bits) that control memory device 130 to not write the masked group are generated by data mask 127 and transmitted by CA interface 111 to memory device 130. Thus, DQ map 127a, based on the interconnect mapping 146b, generates data mask signals associated with the correct groups of DQ interface 135 signals. In other words, DQ map 127a, based on the interconnect mapping 146b, generates data mask signals that take into account that write data received by memory device 130 has been mapped by interconnect mapping 146b to swap a group (e.g., byte, word, etc.) of signal terminals of DQ interface 115 to a different group (e.g., byte, word, etc.) of signal terminals of DQ interface 135.

Figure 2:
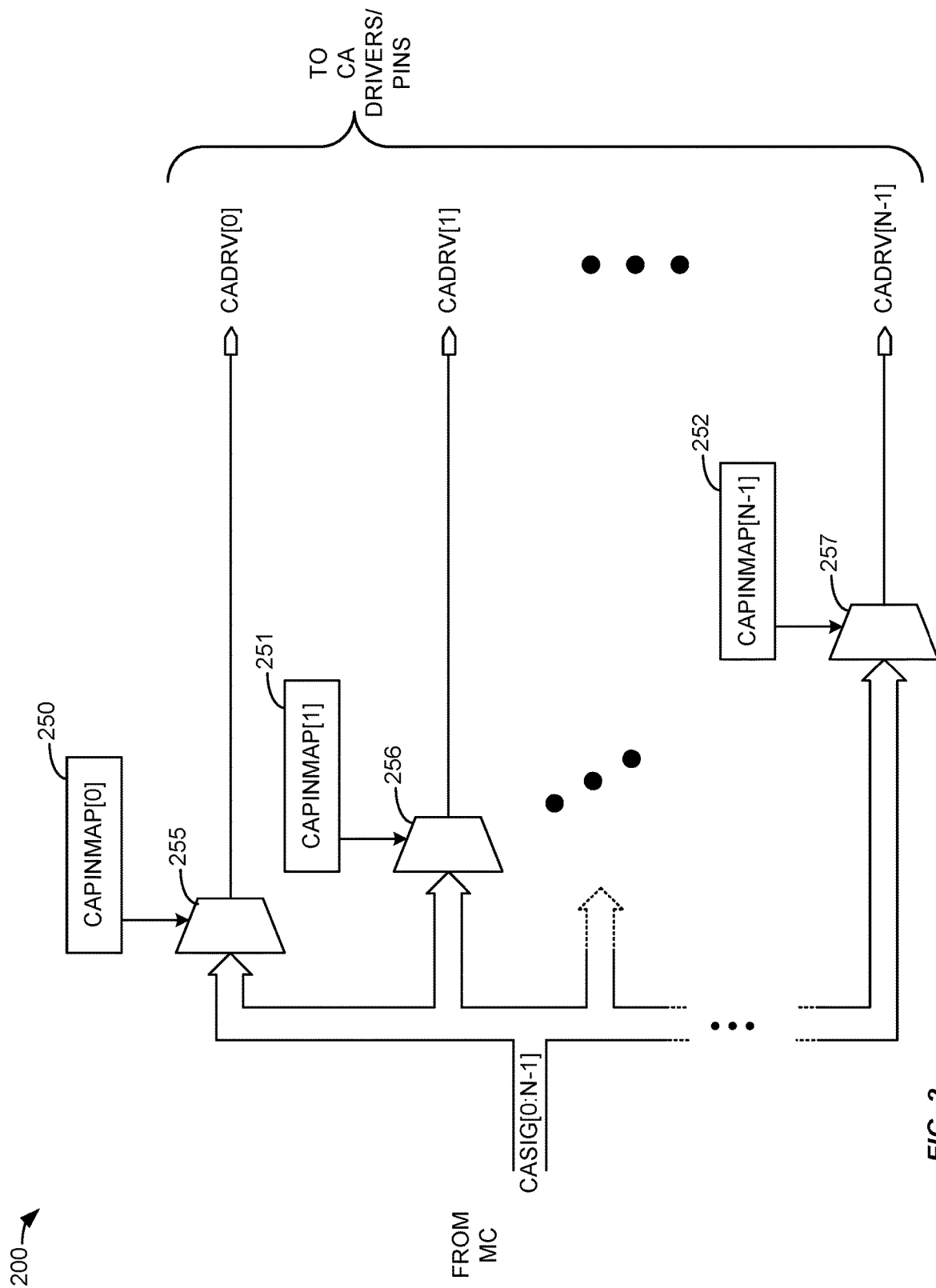
FIG. 2 is a diagram illustrating command/address (CA) interface mapping circuitry.

FIG. 2 is a diagram illustrating command/address (CA) interface mapping circuitry. In FIG. 2, CA interface mapping circuitry 200 comprises N number of mapping registers CAPINMAP[0] to CAPINMAP[N-1] 250-252 and N number of N to 1 multiplexors (MUXs) 255-257. Each MUX 255-257 receives, at its data inputs, N number of CA signals (CASIGS[0:N-1]). Each MUX 255-257 receives the value stored by a corresponding mapping register at its control inputs (i.e., MUX 255 receives the value stored by CAPINMAP[0], MUX2 256 receives the value stored by CAPINMAP[1], etc.)

Each MUX 255-257 output is operatively coupled to a corresponding input to a CA interface (e.g., CA interface 111) driver that drives a corresponding output pin. Thus, it should be understood that the signal CADRV[0] in FIG. 2 controls the output signal on the CA0 pin, CADRV[1] controls the output signal on the CA1 pin, etc. It should also be understood that by setting the values stored in mapping registers 250-252, any logical CA bus signal CASIG[0:N-1] from the memory controller may be mapped to any of the CA bus output pins. In an embodiment, the values stored in the mapping registers 250-253 may be set by a memory controller (e.g., memory controller 110). In an embodiment, the values stored in the mapping registers 250-253 may be set by a host system (e.g., by firmware, software, etc.)

Figure 3:
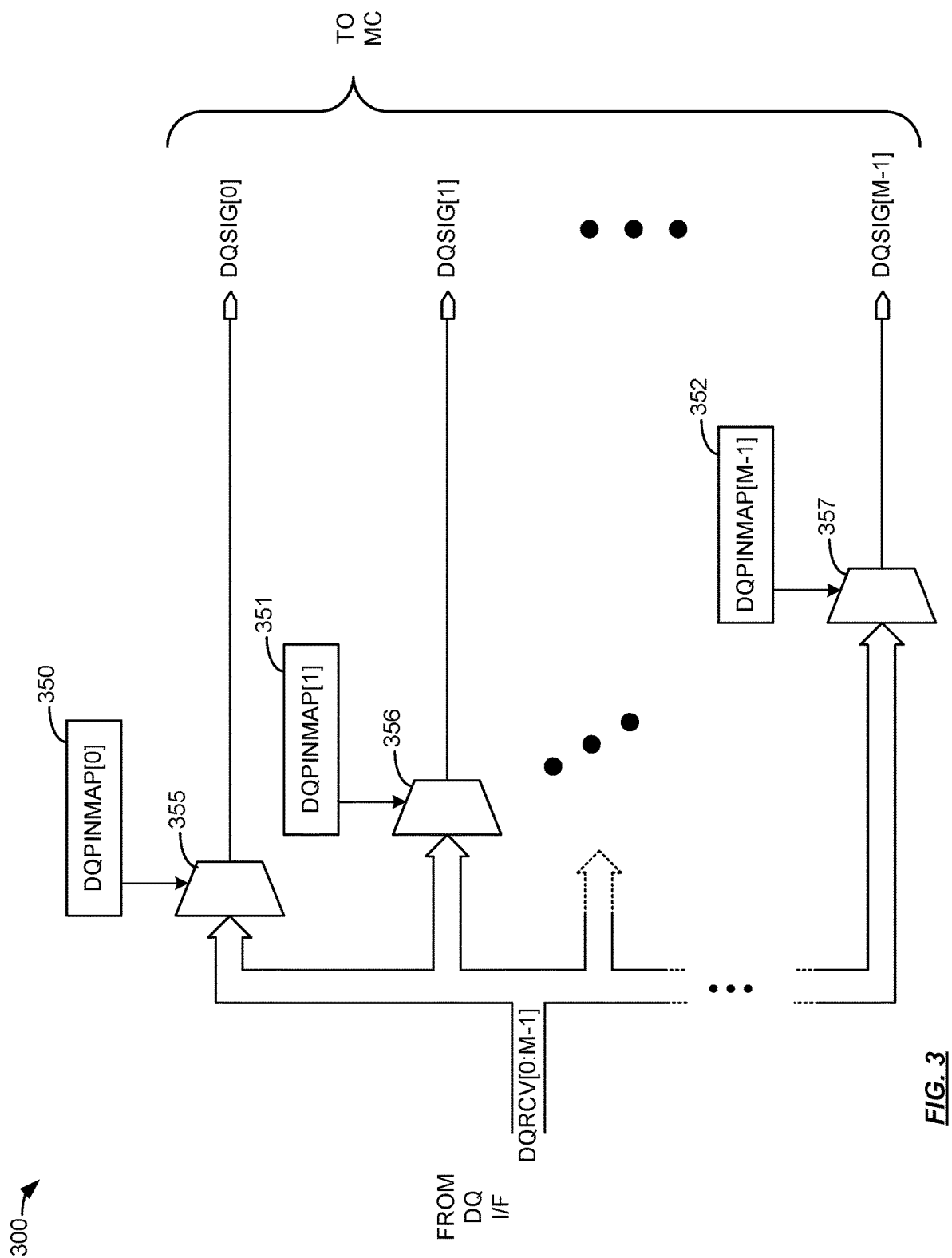
FIG. 3 is a diagram illustrating data (DQ) interface mapping circuitry.

FIG. 3 is a diagram illustrating data (DQ) interface mapping circuitry. In FIG. 3, DQ interface mapping circuitry 300 comprises M number of mapping registers DQPINMAP[0] to DQPINMAP[M-1] 350-352 and M number of M to 1 multiplexors (MUXs) 355-357. Each MUX 355-357 receives, at its data inputs, M number of received (e.g., from DQ interface 115) DQ signals (DQRCVV[0:M-1]). Each MUX 355-357 receives the value stored by a corresponding mapping register at its control inputs (i.e., MUX 355 receives the value stored by DQPINMAP[0], MUX2 256 receives the value stored by DQPINMAP[1], etc.)

Each MUX 355-357 output is operatively coupled to a corresponding signal of an internal (to the memory controller) DQ bus. Thus, it should be understood that the signal DQSIG[0] in FIG. 3 is provided as the input signal (e.g., input to CA training 121, write training 123, EDC calculation 125, etc.) corresponding to the DQ0 interface pin, DQSIG[1] is provided as the input signal corresponding to the DQ1 pin, etc. It should also be understood that by setting the values stored in mapping registers 350-352, any received DQ bus signal DQRCV[0:N-1] from the DQ interface (e.g., DQ interface 115) may be mapped to any of the internal DQ bus signals DQSIG[0:M-1]. In some embodiments, DQRCV[0:N-1] from the DQ interface (e.g., DQ interface 115) may be limited to mappings that only allow bits within the same byte to be mapped to other bits within the same byte of the internal DQ bus signals DQSIG[0:M-1]. In an embodiment, the values stored in the mapping registers 350-353 may be set by a memory controller (e.g., memory controller 110). In an embodiment, the values stored in the mapping registers 350-353 may be set by a host system (e.g., by firmware, software, etc.)

FIG. 4 is a flowchart illustrating a method of operating a memory controller. One or more steps illustrated in FIG. 4 may be performed by, for example, system 100, system 101, and/or their components. Information about a first mapping of connections that relates a plurality of command/address (CA) pins of a CA interface to CA logical functions of a memory device is received (402). For example, system 100 may receive information describing interconnect mapping 141 that relates the mapping of CA interface 111 terminals to CA interface 131 terminals. Information about a second mapping of connections that relates a plurality of data (DQ) pins of a DQ interface to DQ logical bit assignments of the memory device is received (404). For example, system 100 may receive information describing interconnect mapping 146a that relates the mapping of DQ interface 115 terminals to DQ interface 135 terminals.

First circuitry is configured to reverse the first mapping when transmitting commands to the memory device (406). For example, CA interface mapping circuitry 200 may be configured by writing values to CAPINMAP[0:N-1] registers to reverse the effects of interconnect mapping 141 when CA interface 111 is transmitting to memory device 130's CA interface 131. Second circuitry is configured to reverse the second mapping to produce unmapped data (408). For example, DQ interface mapping circuitry 300 may be configured by writing values to DQPINMAP[0:M-1] registers to reverse the effects of interconnect mapping 146a when DQ interface 135 is transmitting data to memory controller 110's DQ interface 115.

Figure 5:
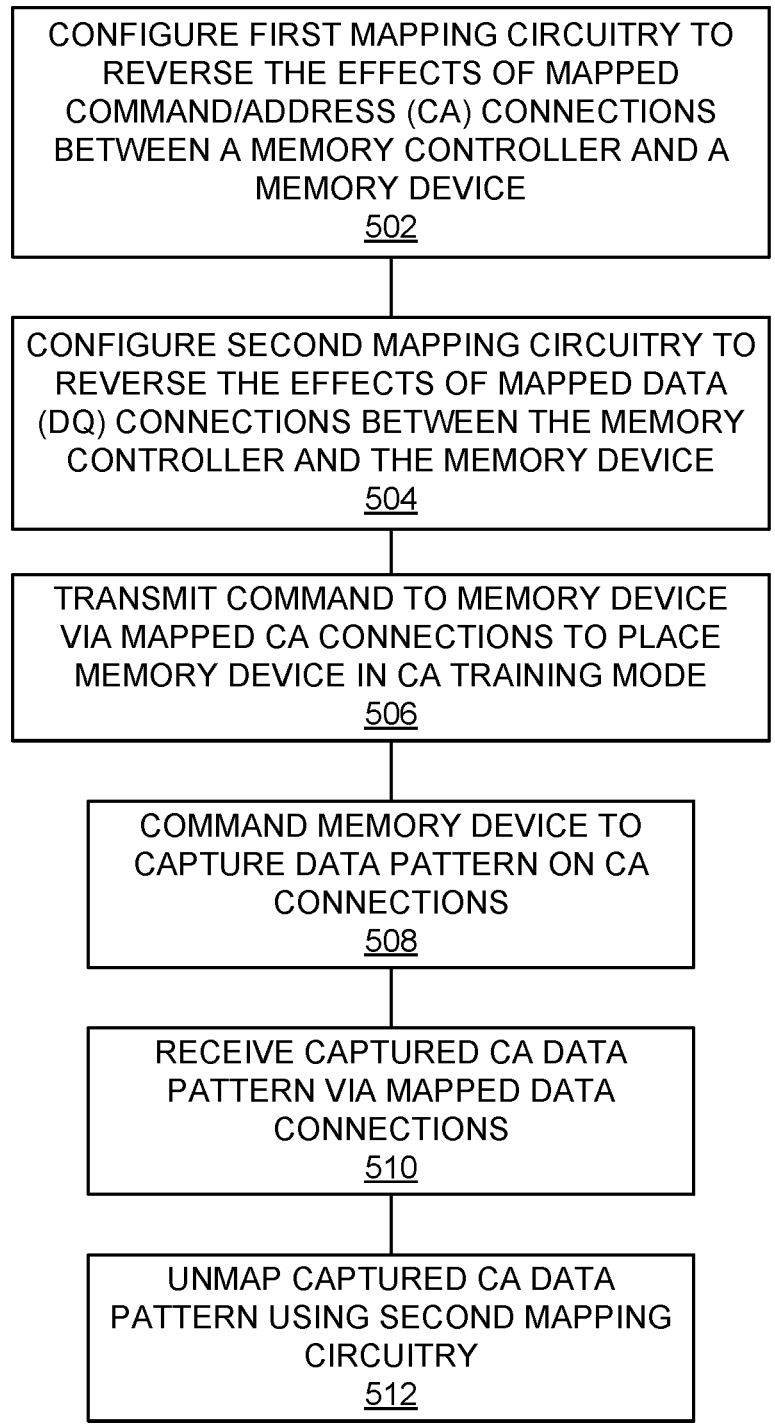
FIG. 5 is a flowchart illustrating a method of CA interface training.

FIG. 5 is a flowchart illustrating a method of CA interface training. One or more steps illustrated in FIG. 5 may be performed by, for example, system 100, system 101, and/or their components. First mapping circuitry is configured to reverse the effects of mapped command/address (CA) connections between a memory controller and a memory device (502). For example, by writing values to remap configuration register 112, remap circuitry 113 may be configured to reverse the effects of interconnect mapping 141 when CA interface 111 is transmitting to memory device 130's CA interface 131. Second mapping circuitry is configured to reverse the effects of mapped data (DQ) connections between the memory controller and the memory device (504). For example, CA-DQ unmap 121a may be configured to reverse the effects of interconnect mapping 146a when DQ interface 135 is transmitting data to memory controller 110's DQ interface 115.

A command is transmitted to the memory device via mapped CA connections to place the memory device in CA training mode (506). For example, memory controller 110 may transmit, to memory device 130 and via interconnect 140 that has interconnect mapping 141, a command to place memory device 130 in a CA training mode. The memory device is commanded to capture data patterns on CA connections (508). For example, memory controller 110 may transmit, to memory device 130 a CA training command to capture data on interconnect 140 using CA interface 131.

A captured CA data pattern is received via the mapped data connections (510). For example, memory device 130 may transmit, via interconnect 145a that has interconnect mapping 146a, data captured by CA interface 131 in response to the command to capture data. In another example, memory device 130 may transmit, via interconnect 145b that has interconnect mapping 146b, data captured by CA interface 131 in response to the command to capture data. Captured data is unmapped using second mapping circuitry (512). For example, CA-DQ unmap 121a may reverse the effects of interconnect mapping 146a. In another example, CA-DQ unmap 121a may reverse the effects of interconnect mapping 146b.

Figure 6:
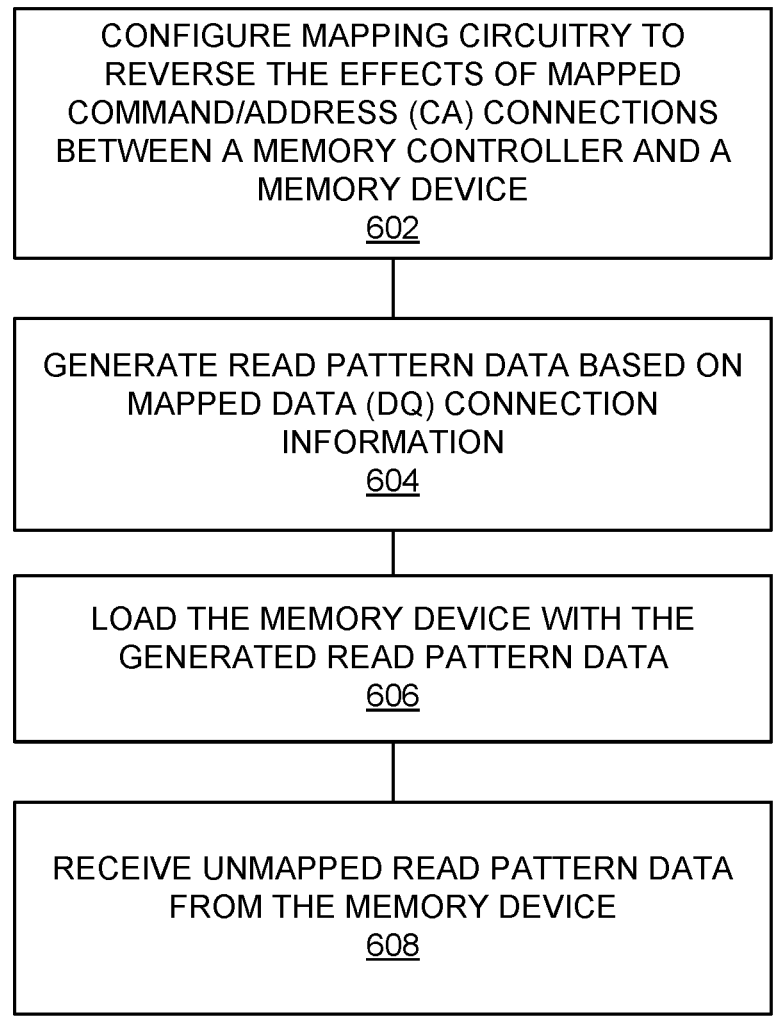
FIG. 6 is a flowchart illustrating a method of preparing a memory device for read training.

FIG. 6 is a flowchart illustrating a method of preparing a memory device for read training. One or more steps illustrated in FIG. 6 may be performed by, for example, system 100, system 101, and/or their components. Mapping circuitry is configured to reverse the effects of mapped command/address (CA) connections between a memory controller and a memory device (602). For example, by writing values to remap configuration register 112, remap circuitry 113 may be configured to reverse the effects of interconnect mapping 141 when CA interface 111 is transmitting to memory device 130's CA interface 131.

Read pattern data is generated base on mapped data (DQ) connection information (604). For example, read training 122 may use DQ unmap pattern 122a circuitry to generate read data patterns that undo the effects of interconnect mapping 146a. The memory device is loaded with the generated read pattern data (606). For example, memory controller 110 may load read pattern storage in memory device 130 with read data patterns that undo the effects of interconnect mapping 146a.

Unmapped read pattern data is received from the memory device (608). For example, memory controller 110 may receive, from memory device 130, read data patterns that have the effects of interconnect mapping 146a undone by the generation processes of box 604.

Figure 7:
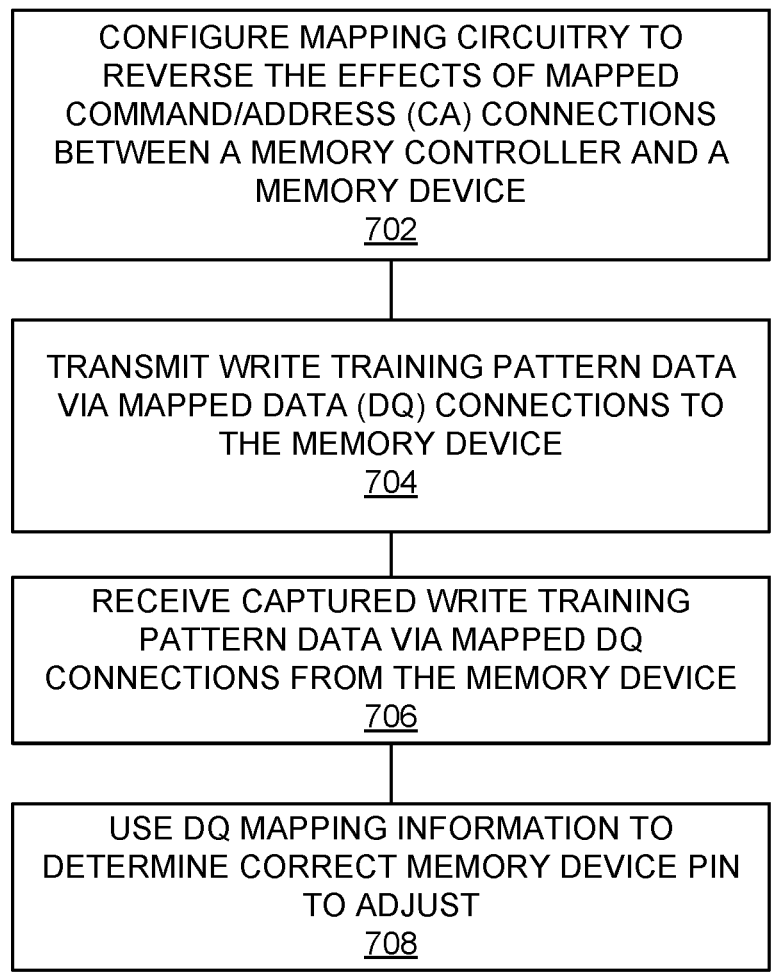
FIG. 7 is a flowchart illustrating a method of adjusting memory device per pin parameters.

FIG. 7 is a flowchart illustrating a method of adjusting memory device per pin parameters. One or more steps illustrated in FIG. 7 may be performed by, for example, system 100, system 101, and/or their components. Mapping circuitry is configured to reverse the effects of mapped command/address (CA) connections between a memory controller and a memory device (702). For example, by writing values to remap configuration register 112, remap circuitry 113 may be configured to reverse the effects of interconnect mapping 141 when CA interface 111 is transmitting to memory device 130's CA interface 131.

Write training pattern data is transmitted via mapped data (DQ) connection to the memory device (704). For example, memory controller 110 may transmit write training pattern data to memory device 130 via interconnect 145a that has interconnect mapping 146a. Captured write training patter data is received, from the memory device, via mapped DQ connections. For example, memory controller 110 may receive captured write training data from memory device 130 that was transmitted via interconnect 145a that has interconnect mapping 146a. DQ mapping information is used to determine the correct memory device pin to adjust (708). For example, to select the correct pin address (number) to adjust DFE or VREFD for that pin, write training 123 may use DQ unmap 123a circuitry to relate sampled write pattern data for a given pin to the pin number address used by memory device 130.

Figure 8:
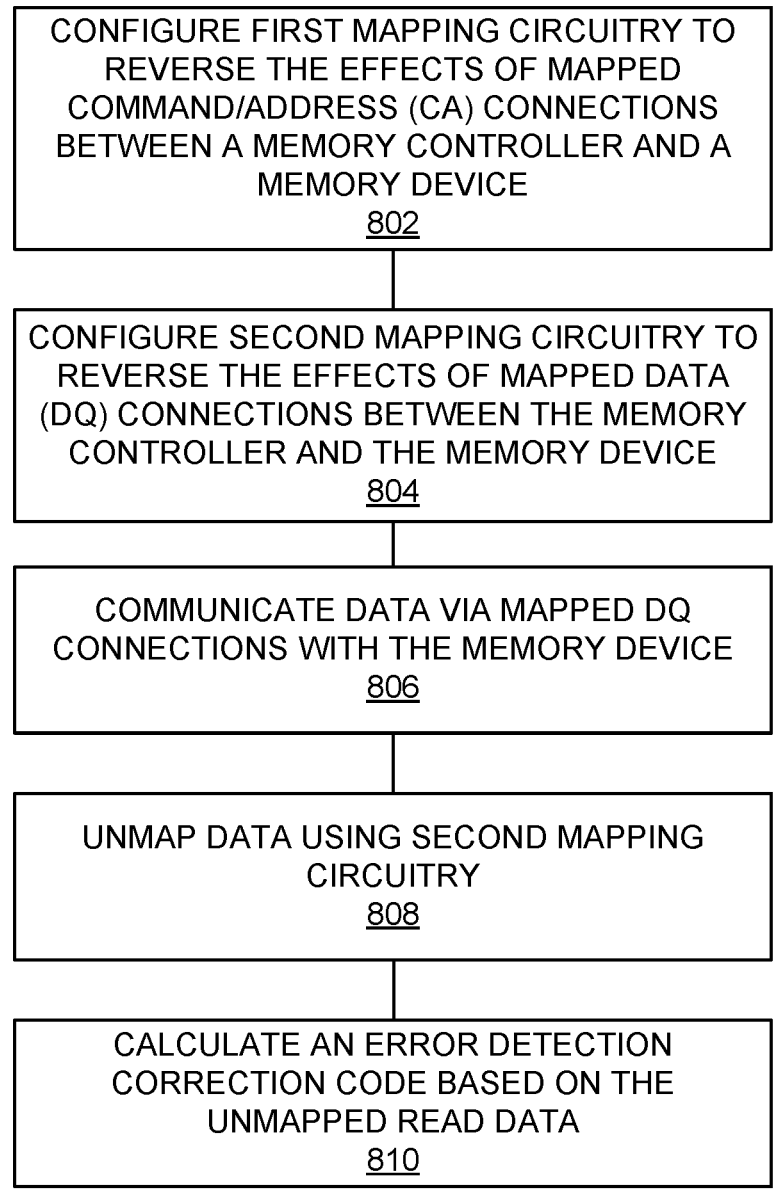
FIG. 8 is a flowchart illustrating a method of calculating an error detection correction code on remapped data.

FIG. 8 is a flowchart illustrating a method of calculating an error detection correction code on remapped data. One or more steps illustrated in FIG. 8 may be performed by, for example, system 100, system 101, and/or their components. First mapping circuitry is configured to reverse the effects of mapped command/address (CA) connections between a memory controller and a memory device (802). For example, by writing values to remap configuration register 112, remap circuitry 113 may be configured to reverse the effects of interconnect mapping 141 when CA interface 111 is transmitting to memory device 130's CA interface 131. Second mapping circuitry is configured to reverse the effects of mapped data (DQ) connections between the memory controller and the memory device (804). For example, DQ unmap 125a may be configured to reverse the effects of interconnect mapping 146a when DQ interface 135 is transmitting data to memory controller 110's DQ interface 115.

Communicate data via the mapped DQ connections with the memory device (806). For example, memory controller 110 may read data from memory device 130 that is transmitted to memory controller 110 via interconnect 145a that has interconnect mapping 146a. In another example, memory controller 110 may write data to memory device 130 that is transmitted to memory device 130 via interconnect 145a that has interconnect mapping 146a. Data is unmapped using the second mapping circuitry (808). For example, DQ unmap 125a may reverse the effects of interconnect mapping 146a on data received via interconnect 145a. In another example, DQ unmap 125a may reverse the effects of interconnect mapping 146a on data transmitted via interconnect 145a. An error detection correction code is calculated based on the unmapped data (810). For example, EDC calculation 125 may calculate an error detection correction code based on data from DQ unmap 125a that has reversed the effects of interconnect mapping 146a.

Figure 9:
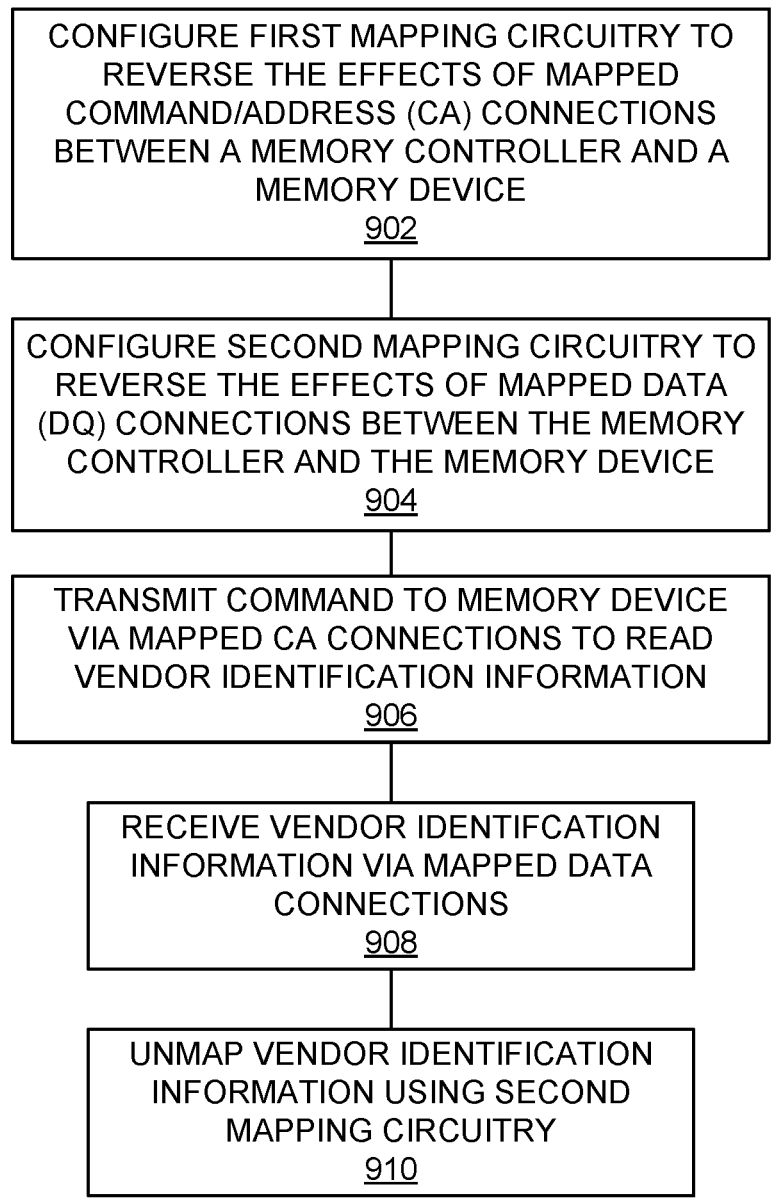
FIG. 9 is a flowchart illustrating a method of reading vendor identification information.

FIG. 9 is a flowchart illustrating a method of reading vendor identification information. One or more steps illustrated in FIG. 9 may be performed by, for example, system 100, system 101, and/or their components. First mapping circuitry is configured to reverse the effects of mapped command/address (CA) connections between a memory controller and a memory device (902). For example, by writing values to remap configuration register 112, remap circuitry 113 may be configured to reverse the effects of interconnect mapping 141 when CA interface 111 is transmitting to memory device 130's CA interface 131. Second mapping circuitry is configured to reverse the effects of mapped data (DQ) connections between the memory controller and the memory device (904). For example, DQ unmap 125a may be configured to reverse the effects of interconnect mapping 146a when DQ interface 135 is transmitting data to memory controller 110's DQ interface 115.

A command is transmitted to the memory device via the mapped CA connections to read vendor identification information (906). For example, memory controller 110 may transmit, to memory device 130 and via interconnect 140 that has interconnect mapping 141, a command to read vendor identification information 144 from memory device 130. Vendor identification information is received via the mapped data connections (908). For example, memory controller 110 may receive vendor identification information from memory device 130 that is transmitted to memory controller 110 via interconnect 145a that has interconnect mapping 146a. Vendor identification information is unmapped using the second mapping circuitry (910). For example, DQ unmap 124a may reverse the effects of interconnect mapping 146a on vendor identification information received via interconnect 145a.

The methods, systems and devices described above may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of system 100, system 101, CA interface mapping circuitry 200, DQ interface mapping circuitry 300, and their components. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 10:
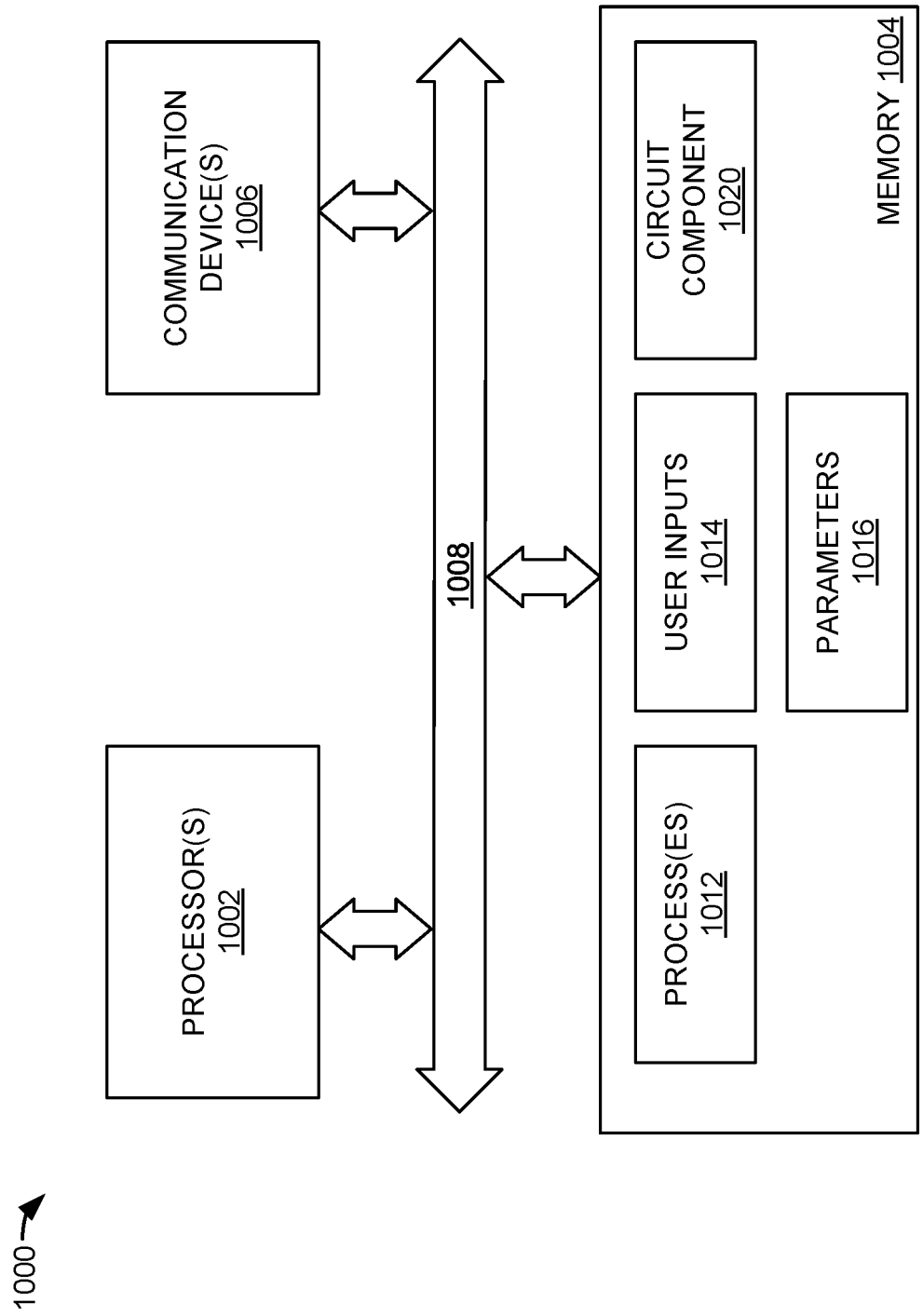
FIG. 10 is a block diagram of a processing system.

FIG. 10 is a block diagram illustrating one embodiment of a processing system 1000 for including, processing, or generating, a representation of a circuit component 1020.

Processing system 1000 includes one or more processors 1002, a memory 1004, and one or more communications devices 1006. Processors 1002, memory 1004, and communications devices 1006 communicate using any suitable type, number, and/or configuration of wired and/or wireless connections 1008.

Processors 1002 execute instructions of one or more processes 1012 stored in a memory 1004 to process and/or generate circuit component 1020 responsive to user inputs 1014 and parameters 1016. Processes 1012 may be any suitable electronic design automation (EDA) tool or portion thereof used to design, simulate, analyze, and/or verify electronic circuitry and/or generate photomasks for electronic circuitry. Representation 1020 includes data that describes all or portions of system 100, system 101, CA interface mapping circuitry 200, DQ interface mapping circuitry 300, and their components, as shown in the Figures.

Representation 1020 may include one or more of behavioral, register transfer, logic component, transistor, and layout geometry-level descriptions. Moreover, representation 1020 may be stored on storage media or communicated by carrier waves.

Data formats in which representation 1020 may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email User inputs 1014 may comprise input parameters from a keyboard, mouse, voice recognition interface, microphone and speakers, graphical display, touch screen, or other type of user interface device. This user interface may be distributed among multiple interface devices. Parameters 1016 may include specifications and/or characteristics that are input to help define representation 1020. For example, parameters 1016 may include information that defines device types (e.g., NFET, PFET, etc.), topology (e.g., block diagrams, circuit descriptions, schematics, etc.), and/or device descriptions (e.g., device properties, device dimensions, power supply voltages, simulation temperatures, simulation models, etc.).

Memory 1004 includes any suitable type, number, and/or configuration of non-transitory computer-readable storage media that stores processes 1012, user inputs 1014, parameters 1016, and circuit component 1020.

Communications devices 1006 include any suitable type, number, and/or configuration of wired and/or wireless devices that transmit information from processing system 1000 to another processing or storage system (not shown) and/or receive information from another processing or storage system (not shown). For example, communications devices 1006 may transmit circuit component 1020 to another system. Communications devices 1006 may receive processes 1012, user inputs 1014, parameters 1016, and/or circuit component 1020 and cause processes 1012, user inputs 1014, parameters 1016, and/or circuit component 1020 to be stored in memory 1004.

Implementations discussed herein include, but are not limited to, the following examples:

EXAMPLE 1

A memory controller integrated circuit, comprising: a command/address (CA) interface comprising a first plurality of terminals to communicate a corresponding plurality of CA signals, each of the first plurality of terminals configurable to function as a selectable one of the plurality of CA signals; and, a data (DQ) interface comprising a second plurality of terminals to communicate a corresponding plurality of DQ signals, each of the second plurality of terminals configurable to function as a selectable one of the plurality of DQ signals.

EXAMPLE 2

The memory controller integrated circuit of example 1, further comprising: CA interface training circuitry configured to account for a first mapping of each of the first plurality of terminals to respective ones of the plurality of CA signals.

EXAMPLE 3

The memory controller integrated circuit of example 2, wherein the CA interface training circuitry is further configured to account for a second mapping of each of the second plurality of terminals configurable to respective ones of the plurality of DQ signals.

EXAMPLE 4

The memory controller integrated circuit of example 1, further comprising: error detection code calculation circuitry configured to account for a mapping of each of the second plurality of terminals to respective ones of the plurality of DQ signals.

EXAMPLE 5

The memory controller integrated circuit of example 1, further comprising: vendor identification reading circuitry configured to account for a mapping of each of the second plurality of terminals to respective ones of the plurality of DQ signals.

EXAMPLE 6

The memory controller integrated circuit of example 1, wherein groups of the second plurality of terminals are configurable to function as selectable groups of the plurality of DQ signals.

EXAMPLE 7

The memory controller integrated circuit of example 6, wherein the groups of the second plurality of terminals and the groups of the plurality of DQ signals are eight bit groups.

EXAMPLE 8

The memory controller integrated circuit of example 7, further comprising: clock training circuitry configured to account for a mapping of the groups of the second plurality of terminals to respective groups of the plurality of DQ signals.

EXAMPLE 9

The memory controller integrated circuit of example 7, further comprising: byte masking circuitry configured to account for a mapping of the groups of the second plurality of terminals to respective groups of the plurality of DQ signals.

EXAMPLE 10

A memory controller, comprising: a command/address (CA) interface comprising a first plurality of terminals to communicate a corresponding plurality of CA signals; CA mapping circuitry to configure a first mapping of each of the first plurality of terminals to convey a respective one of the plurality of CA signals; a data (DQ) interface comprising a second plurality of terminals to communicate a corresponding plurality of DQ signals; and, DQ mapping circuitry to configure a second mapping of each of the second plurality of terminals to convey a respective one of the plurality of DQ signals.

EXAMPLE 11

The memory controller of example 10, wherein the second mapping maps eight bit groups.

EXAMPLE 12

The memory controller of example 11, further comprising: clock training circuitry configured to account for the second mapping.

EXAMPLE 13

The memory controller of example 12, further comprising: byte masking circuitry configured to account for the second mapping.

EXAMPLE 14

The memory controller of example 10, further comprising: CA interface training circuitry configured to account for the first mapping.

EXAMPLE 15

The memory controller of example 14, wherein the CA interface training circuitry is further configured to account for the second mapping.

EXAMPLE 16

The memory controller of example 10, further comprising: error detect code (EDC) calculation circuitry configured to account for the second mapping.

EXAMPLE 17

The memory controller of example 10, further comprising: vendor identification reading circuitry configured to account for the second mapping.

EXAMPLE 18

A method of operating a memory controller, comprising: receiving information about a first mapping of connections that relates a plurality of command/address (CA) pins of a CA interface to CA logical functions of a memory device; receiving information about a second mapping of connections that relates a plurality of data (DQ) pins of a DQ interface to DQ logical bit assignments of the memory device; configuring first circuitry to reverse the first mapping when transmitting commands to the memory device; and, configuring second circuitry to reverse the second mapping to produce unmapped data.

EXAMPLE 19

The method of example 18, further comprising: training the CA interface based on the first mapping.

EXAMPLE 20

The method of example 18, further comprising: training the CA interface based on the second mapping.

EXAMPLE 21

The method of example 18, further comprising: calculating EDC information using the unmapped data.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A memory controller integrated circuit, comprising:
a command/address (CA) interface comprising a first plurality of terminals to communicate a corresponding plurality of CA signals, each of the first plurality of terminals configurable to function as a selectable one of the plurality of CA signals;
a data (DQ) interface comprising a second plurality of terminals to communicate a corresponding plurality of DQ signals, each of the second plurality of terminals configurable to function as a selectable one of the plurality of DQ signals; and
a CA interconnect including a plurality of interconnect mappings, wherein the CA interconnect maps at least one signal terminal to a different signal terminal of the CA interface through the plurality of interconnect mappings.

2. The memory controller integrated circuit of claim 1, further comprising:
CA interface training circuitry configured to account for a first mapping of each of the first plurality of terminals to respective ones of the plurality of CA signals.

3. The memory controller integrated circuit of claim 2, wherein the CA interface training circuitry is further configured to account for a second mapping of each of the second plurality of terminals configurable to respective ones of the plurality of DQ signals.

4. The memory controller integrated circuit of claim 1, further comprising:
error detection code calculation circuitry configured to account for a mapping of each of the second plurality of terminals to respective ones of the plurality of DQ signals.

5. The memory controller integrated circuit of claim 1, further comprising:
vendor identification reading circuitry configured to account for a mapping of each of the second plurality of terminals to respective ones of the plurality of DQ signals.

6. The memory controller integrated circuit of claim 1, wherein groups of the second plurality of terminals are configurable to function as selectable groups of the plurality of DQ signals.

7. The memory controller integrated circuit of claim 6, wherein the groups of the second plurality of terminals and the groups of the plurality of DQ signals are eight bit groups.

8. The memory controller integrated circuit of claim 7, further comprising:
clock training circuitry configured to account for a mapping of the groups of the second plurality of terminals to respective groups of the plurality of DQ signals.

9. The memory controller integrated circuit of claim 7, further comprising:
byte masking circuitry configured to account for a mapping of the groups of the second plurality of terminals to respective groups of the plurality of DQ signals.

10. A memory controller, comprising:
a command/address (CA) interface comprising a first plurality of terminals to communicate a corresponding plurality of CA signals;
CA mapping circuitry to configure a first mapping of each of the first plurality of terminals to convey a respective one of the plurality of CA signals;
a data (DQ) interface comprising a second plurality of terminals to communicate a corresponding plurality of DQ signals;
DQ mapping circuitry to configure a second mapping of each of the second plurality of terminals to convey a respective one of the plurality of DQ signals; and
a CA interconnect including a plurality of interconnect mappings, wherein the CA interconnect maps at least one signal terminal to a different signal terminal of the CA interface through the plurality of interconnect mappings.

11. The memory controller of claim 10, wherein the second mapping maps eight bit groups.

12. The memory controller of claim 11, further comprising:
clock training circuitry configured to account for the second mapping.

13. The memory controller of claim 12, further comprising:
byte masking circuitry configured to account for the second mapping.

14. The memory controller of claim 10, further comprising:
CA interface training circuitry configured to account for the first mapping.

15. The memory controller of claim 14, wherein the CA interface training circuitry is further configured to account for the second mapping.

16. The memory controller of claim 10, further comprising: error detect correct (EDC) calculation circuitry configured to account for the second mapping.

17. The memory controller of claim 10, further comprising:
vendor identification reading circuitry configured to account for the second mapping.

18. A method of operating a memory controller, comprising:
receiving information about a first mapping of connections that relates a plurality of command/address (CA) pins of a CA interface to CA logical functions of a memory device;
receiving information about a second mapping of connections that relates a plurality of data (DQ) pins of a DQ interface to DQ logical bit assignments of the memory device;
configuring first circuitry to reverse the first mapping when transmitting commands to the memory device;
configuring second circuitry to reverse the second mapping to produce unmapped data; and
providing a CA interconnect including a plurality of interconnect mappings, wherein the CA interconnect maps at least one signal terminal to a different signal terminal of the CA interface through the plurality of interconnect mappings.

19. The method of claim 18, further comprising:
training the CA interface based on the first mapping.

20. The method of claim 18, further comprising:
training the DQ interface per pin settings based on the second mapping.

* * * * *